(12) United States Patent
Nishida et al.

(10) Patent No.: US 6,704,916 B1
(45) Date of Patent: Mar. 9, 2004

(54) METHOD AND APPARATUS FOR OPTIMIZING PLACEMENT AND ROUTING AND RECORDING MEDIUM FOR RECORDING PROGRAM FOR OPTIMIZING PLACEMENT AND ROUTING

(75) Inventors: Takeshi Nishida, Tokyo (JP); Yoshio Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/512,348

(22) Filed: Feb. 24, 2000

(30) Foreign Application Priority Data

Oct. 5, 1999 (JP) ............................. 11-284826

(51) Int. Cl.⁷ ................................. G06F 9/45
(52) U.S. Cl. ............................. 716/10; 716/2
(58) Field of Search ................. 716/2, 6, 8, 9, 716/10, 12, 13, 14

(56) References Cited

U.S. PATENT DOCUMENTS 5,999,716 A * 12/1999 Toyonaga .................... 716/10
6,099,580 A * 8/2000 Boyle et al. .................. 716/7
6,442,743 B1 * 8/2002 Sarrafzadeh et al. .......... 716/10
6,449,578 B1 * 9/2002 McBride ...................... 702/119
2001/0010090 A1 * 7/2001 Boyle et al. .................. 716/2

FOREIGN PATENT DOCUMENTS

| JP | 5121546 | 5/1993 |
| JP | 6180733 | 6/1994 |
| JP | 6223134 | 8/1994 |
| JP | 786408 | 3/1995 |
| JP | 7239834 | 9/1995 |

* cited by examiner

Primary Examiner—Stacy Whitmore
(74) Attorney, Agent, or Firm—Leydig, Voit & Mayer, Ltd.

(57) ABSTRACT

A method for optimizing placement and routing includes producing a net list constituting circuit connection information in a hardware description language, executing logic synthesis of the net list to output a gate-level net list with optimized logic, determining clusterings based on logic gap information used for optimizing the logic, outputting clustering information expressing a particular determination, and executing placement and routing based on the gate-level net list and the clustering information.

2 Claims, 12 Drawing Sheets

```
BLOCK Block_1;
CLUSTER Cluster_1;
gate_0, gate_1, gate_2;
END CLUSTER Cluster_1;
CLUSTER Cluster_2;
gate_3, gate_4, gate_5;
END CLUSTER Cluster_2;
END BLOCK Block_1;
```

FIG.8
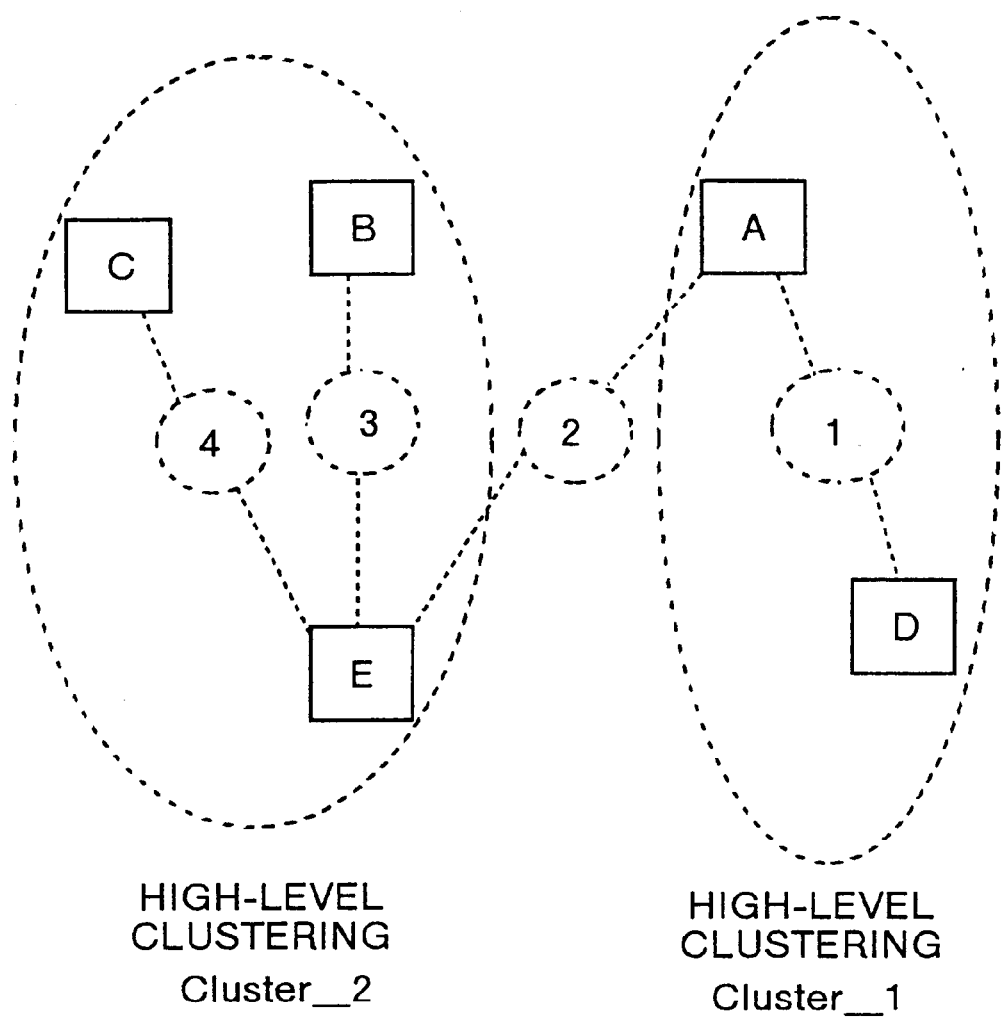
HIGH-LEVEL CLUSTERING
Cluster_2
HIGH-LEVEL CLUSTERING
Cluster_1
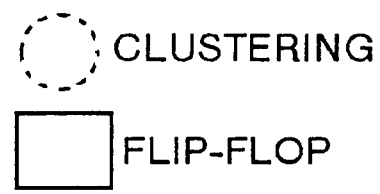

FIG.9

```
BLOCK Block_1;
Cluster Cluster_1 A, 1, D;
    path_delay A-1-D 2ns;
Cluster Cluster_2 B, 3, E, 4, C;
    path_delay B-3-E 1ns;
    path_delay E-4-C 1ns;
END BLOCK Block_1;
```

```
Cluster Cluster_1   1-A-2;
Cluster Cluster_2   3-C-4;
```

METHOD AND APPARATUS FOR OPTIMIZING PLACEMENT AND ROUTING AND RECORDING MEDIUM FOR RECORDING PROGRAM FOR OPTIMIZING PLACEMENT AND ROUTING

FIELD OF THE INVENTION

The present invention relates to a method and an apparatus for optimizing placement and routing capable of realizing optimum placement and routing (layout) by supplying information on the optimum placement and routing of blocks using design tools (a logic synthesis tool, a timing analysis tool and a net list analysis tool) for LSI design, and to a recording medium for recording a program for optimizing placement and routing.

BACKGROUND OF THE INVENTION

A conventional method of placement and routing (layout) will be described below with reference to the drawings. FIG. 14 is a flowchart showing a conventional method of placement and routing. In recent years, the HDL (hardware description language) is widely used for the logic design. An LSI designer, who used the HDL, expresses a circuit with a description of RTL (register transfer level) of a high abstractness or a high behavior level. In other words, a net list constituting connection information is produced by use of the HDL described at high level (step S101).

After that, the net list produced by the designer is logically synthesized utilizing a logic synthesis tool (step S102) and converted into a net list at gate level (step S103) The logic synthesis is defined as "a process of realizing a design of low level by mapping the library components automatically from the description of high level". In the logic synthesis tool, design restraints, such as circuit area, processing speed, and the power consumption, can be set. The process for optimization is performed by combining these restraints. Therefore, when the gate size that can be logically synthesized is small due to the restraints of the logic synthesis tools, then a detailed hierarchical description is required.

Finally, the net list of gate level outputs from the logic synthesis tool is provided as an input to the layout tool, and placement and routing is carried out based on this net list (step S104). In the process, clustering is effected based on the hierarchical information of the net list, and wiring is conducted with this state as the optimum placement. The clustering as referred to here is defined as "the process for producing optimized clustering at layout level."

As described above, in the conventional placement and routing, the net list of gate level produced by the logic synthesis tool is input into the layout tool thereby to carry out the optimum placement and routing. The latest logic synthesis tool has a somewhat increased gate size capable of being logically synthesized due to the improved performance. A gate size of larger scale can thus be described with HDL without the need of detailed hierarchical description on the part of the designer.

However, when the logic synthesis is performed using the logic synthesis tool by the conventional method of placement and routing described above, the net list of outputs is flattened in the block described in HDL collectively. As a result, the hierarchy of the net list after synthesis is lost, and the block subjected to placement and routing is flattened. This leads to the problem that the optimum placement and routing utilizing the layout tool becomes difficult. Specifically, when arranging a collectively synthesized large gate circuit utilizing the layout tool, this gate circuit is arranged only by the connections specified by the net list, followed by routing, with the undesirable result that the wiring becomes longer and the chip area becomes larger than when it is described hierarchically.

SUMMARY OF THE INVENTION

The present invention has been achieved in view of the facts described above. It is the object of this invention to provide a method and an apparatus for optimizing the placement and routing which comprises for producing the optimum clustering information even in the case where a large gate circuit is collectively logically synthesized, in which by optimizing the placement and routing based on the particular clustering information, the wiring length can be shortened and the chip area can be reduced on the one hand, and to provide a recording medium for storing a program for the optimization of the placement and routing on the other hand.

In order to solve the problems and to achieve the object described above, according to a first aspect of the present invention, for optimizing the placement and routing, comprising the steps of producing a net list constituting the circuit connection information in a high-level hardware description language (HDL); executing the logic synthesis of the net list thereby to optimize the logic and output a net list of gate level, determining the clustering based on the logic gap information used for optimizing the logic, and outputting the clustering information representing this determination; and carrying out the placement and routing based on the net list of gate level and the clustering information. Thus, the placement and routing is not carried out by taking only the gate connections into consideration as in the conventional art. In addition, the clusterings in the block are arranged based on the net list of gate level and the clustering information output by the processing of the logic synthesis step, and the gates are arranged in the clusterings and wired.

Further, the step of executing the logic synthesis includes the substeps of extracting the connection information of each clustering in a block that can be synthesized collectively and the connection information of the gates in each of the clusterings from the logic gap information, and based on these information, generating the clustering information. Thus, the connection information of each clustering in a block and the connection information between gates in each clustering are extracted, and based on these information, the clustering information is generated thereby to complement the hierarchical information not described.

Further, the step of placement and routing includes the substeps of arranging the block obtained from the clustering information, subsequently arranging each clustering for each block, further arranging corresponding gates in the clustering, and connecting the wiring between the gates in the state where all the gates are arranged. Thus, the wiring between the gates can be accommodated in the clustering, resulting in a reduced redundant wiring.

According to another aspect of the present invention, a method for optimizing the placement and routing comprises the steps of producing a net list constituting the connection information of the circuits by the hardware description language (HDL) and outputting the net list, analyzing the timing of the net list thereby to output the clustering information including the path delay information between the flip-flops in the net list, and carrying out the placement and routing based on the net list and the clustering information including the path delay information. Thus, the placement and routing is not carried out taking only the gate connections into consideration. In addition, the clusterings are arranged in a block based on the net list described in HDL and the clustering information (including the path delay between the flip-flops) output by the processing of the timing analysis step. Further, the gates are arranged in the clusterings, respectively, and are wired.

Further, the step of timing analysis includes the substeps of determining the clusterings in the descending order of rigidity of the timing restraint based on the path delay information between the flip-flops, and in the case where it is determined that a plurality of clusterings can be included in a block capable of being collectively synthesized, setting a high-level clustering including the plurality of the clusterings, and under this condition, generating the clustering information which expresses all the path delay information and the configuration of the clusterings. Thus, the hierarchical information not described is complemented by generating the clustering information based on the path delay information between the flip-flops.

Further, the step of placement and routing includes the substep of arranging the clusterings in the descending order of rigidity of the timing restraint based on the clustering information, subsequently arranging each corresponding gate in these clusterings, and with all the gates arranged, carrying out the wiring between the gates. Thus, the wiring between the gates can be accommodated in the clustering and further since the path delay between the flip-flops and the net list are acquired, the redundant wiring is reduced.

Further, the step of net list analysis includes the substeps of recognizing, as one clustering, each net list obtained from the information between each output terminal of the block and each of the flip-flops and the information between the flip-flops, and in the case where it is determined that a plurality of clusterings can be included in a block capable of being collectively synthesized, setting a high-level clustering including the plurality of the clusterings, and under this condition, generating the clustering information expressing the configuration of all the clusterings. Thus, the hierarchical information not described is complemented by generating the clustering information based on the net list acquired from the information between each output terminal of the block and each flip-flop and the information between the flip-flops.

According to still another aspect of the present invention, there is provided an apparatus for optimizing the placement and routing, wherein the logic synthesis of a net list generated by a hardware description language (HDL) of high level is executed thereby to generate a net list of gate level. Further, the clustering is determined based on the logic gap information used for the logic synthesis, after which the clustering information expressing this determination is generated. Under this condition, the placement and routing is carried out based on the net list of the gate level and the clustering information. Thus, the clusterings are arranged in a block based on the net list of gate level output by the processing of logic synthesis and the clustering information. Further, each gate is arranged in a corresponding clustering, and these gates are wired.

Further, the timing analysis of the net list produced by the hardware description language (HDL) is executed thereby to generate the clustering information including the path delay information between the flip-flops in the net list, and under this condition, the placement and routing is carried out based on the net list and the clustering information including the path delay information. Thus, the clustering is arranged in a block based on the net list described in HDL and the clustering information (including the path delay between the flip-flops) output by the processing at the time of timing analysis, and further the gate is arranged in each clustering and wired.

Other objects and features of this invention will become apparent from the following description with reference to the accompanying drawings.

BRIEF DESCRIPTION OF THE DRAWINGS

FIG. 8 is a diagram showing an example of forming the clusters;

FIG. 9 is a diagram showing a specific example of clustering information;

DESCRIPTION OF THE PREFERRED EMBODIMENTS

A method for optimizing the placement and routing according to the embodiments of the present invention will be described in detail below with reference to the drawings. The present invention is not limited to these embodiments.

Figure 1:
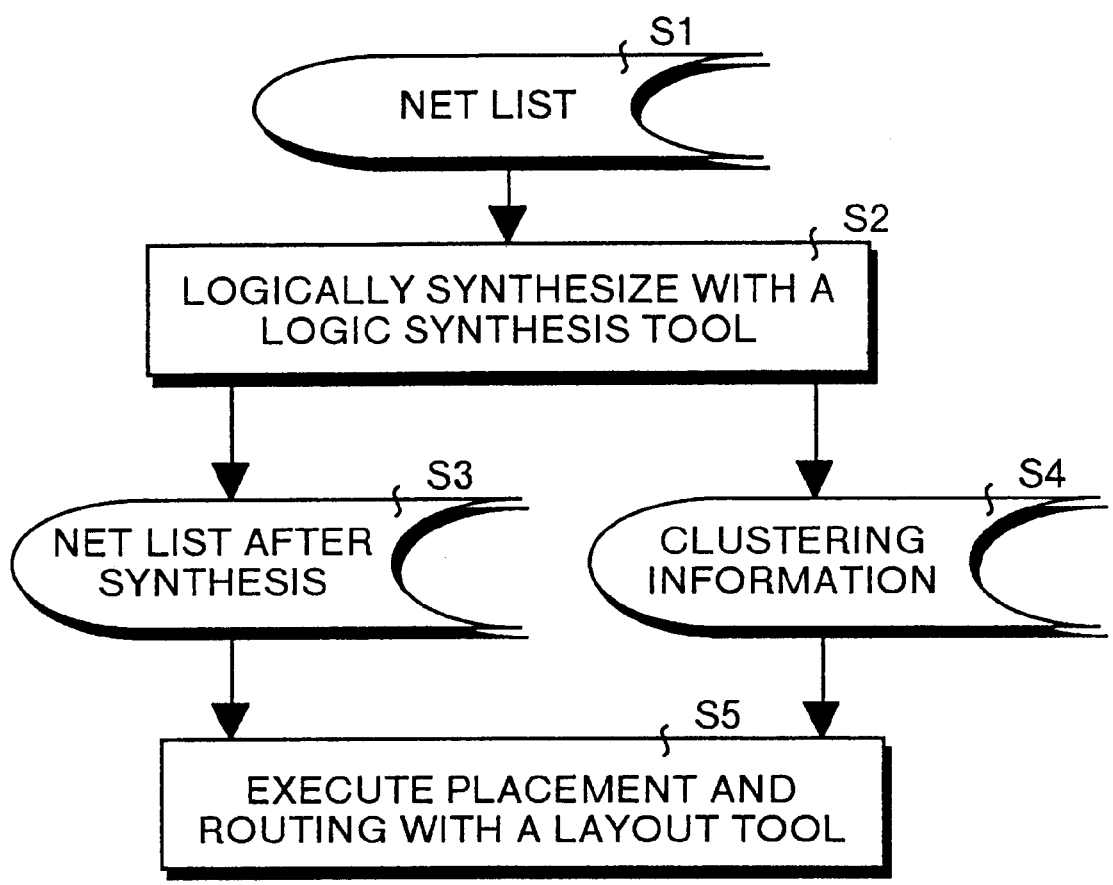
FIG. 1 is a flowchart showing a method for optimizing placement and routing according to a first embodiment of the present invention.

First Embodiment:

FIG. 1 is a flowchart showing a method for optimizing the placement and routing according to the first embodiment of the present invention. This embodiment is applicable to the LSI design that uses the hardware description language (HDL) First, the LSI designer, who uses the description in HDL, expresses a circuit with a description of high level with a high RTL (register transfer level) having a high abstractness or a high behavior level. In other words, a net list constituting the connection information is produced using the description in HDL at high level (step S1).

After that, the net list generated by the designer is logically synthesized utilizing a logic synthesis tool. This logic synthesis tool is a tool according to this embodiment and it is described in detail later (step S2). The net list is then converted into a net list of gate level (step S3). In addition to the net list of gate level, clustering information described later is output (step S4). The logic synthesis as referred to here is defined as the process similar to the logic synthesis defined in the conventional art. The circuit area, processing speed, power consumption and other design restraints can also be set in this logic synthesis tool. The optimization process is performed by combining these restraints with a method for producing the clustering information. However, when the gate size in which the net list can be logically synthesized collectively is small due to the restraints of the logical synthesis tool, then the production of detailed hierarchical information is required.

Finally, the net list of gate level constituting the output of the logic synthesis tool and the clustering information are provided as input into the layout tool according to this embodiment, and the optimum placement and routing is carried out under this condition (step S5). The clustering information in the following description means "the optimized clustering for layout".

According to this embodiment; as described above, the optimum placement and routing is realized by applying the gate-level net list produced by the logic synthesis tool and the clustering information as an input to the layout tool.

Figure 2:
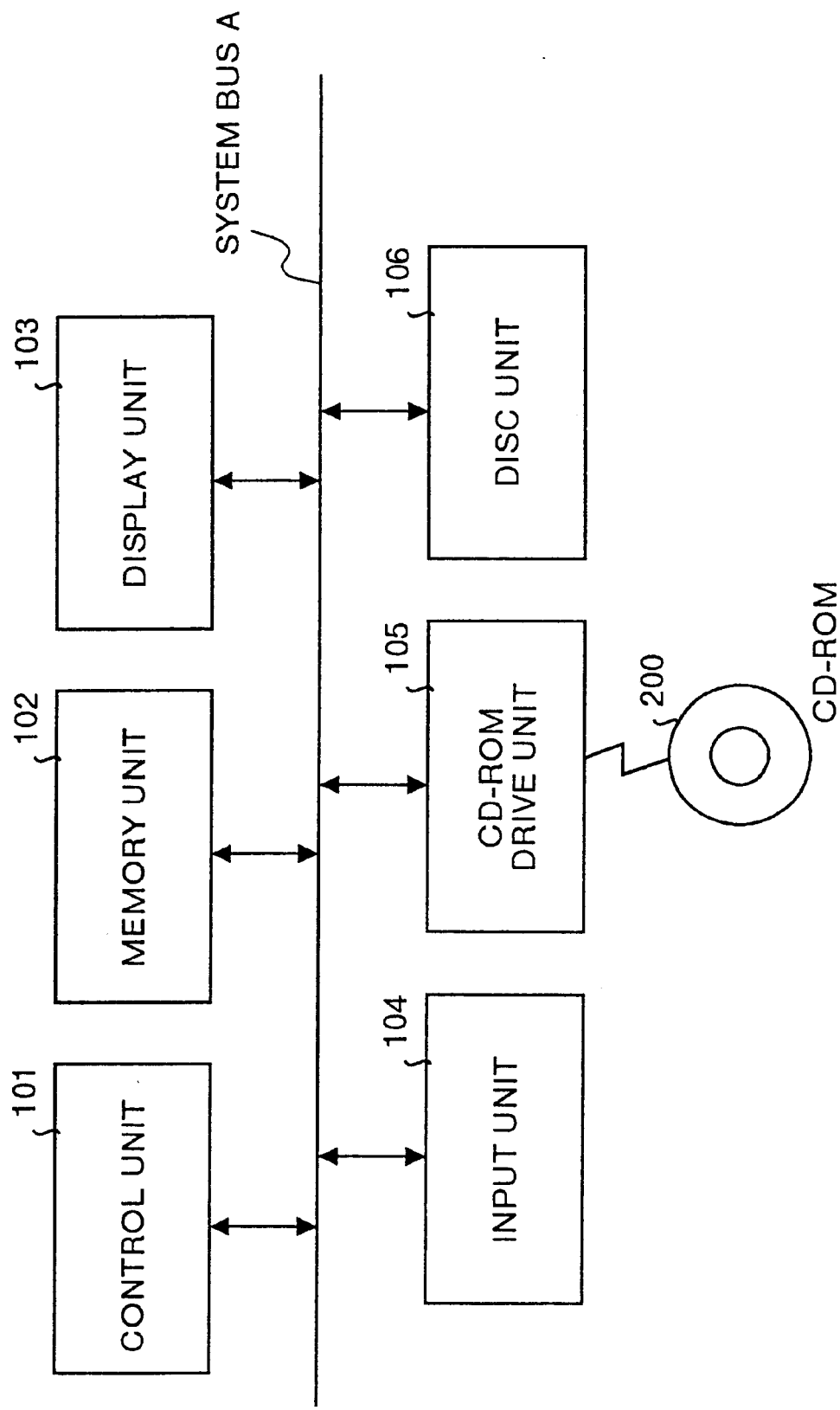
FIG. 2 is a diagram showing a configuration of an apparatus for optimizing placement and routing which executes the method for optimizing placement and routing.

FIG. 2 is a diagram showing a configuration of a general computer system which operates as an apparatus for executing the method for optimizing the placement and routing described above. A program such as the logic synthesis tool and the layout tool can be executed on this computer system.

This computer system includes a control unit 101 having a CPU, a memory unit 102, a display unit 103, an input unit 104, a CD-ROM drive unit 105 and a disk unit 106. These units are connected to each other through a system bus A. The control unit 101 executes the process (described with reference to FIGS. 3, 4, 5) for logic synthesis and placement (layout) and routing. The memory unit 102 is a memory such as a RAM or ROM and stores a program to be executed by the control unit 101 and the required data obtained during the processing. The display unit 103 is a CRT or a LCD (liquid crystal display) for displaying various screens to the user (the LSI designer) of the computer system. The input unit 104 is a keyboard or a mouse, and is used by the user of the computer system to input various information. The CD-ROM 200 shown in this figure stores a program of the process.

In the computer system configured as described above, first, the CD-ROM 200 is set in the CD-ROM drive unit 105 and the program stored in this CD-ROM 200 is installed in the disk unit 106. When the operation of the computer system is started, the program is read from the disk unit 106 and stored in the memory unit 102. The control unit 101 (CPU) executes the process shown in FIG. 1 in accordance with the program stored in the memory unit 102.

The present invention provides a program describing the process of the logic synthesis tool and the layout tool on the CD-ROM 200 as a storage medium. However the storage medium is not limited to the CD-ROM 200 but can be a magnetic disk such as a floppy disk, a magneto-optic disk, a magnetic tape or the like. The recording medium may be selected depending upon the used computer. Further, this program can be stored in advance in the disk unit 106.

Figure 3:
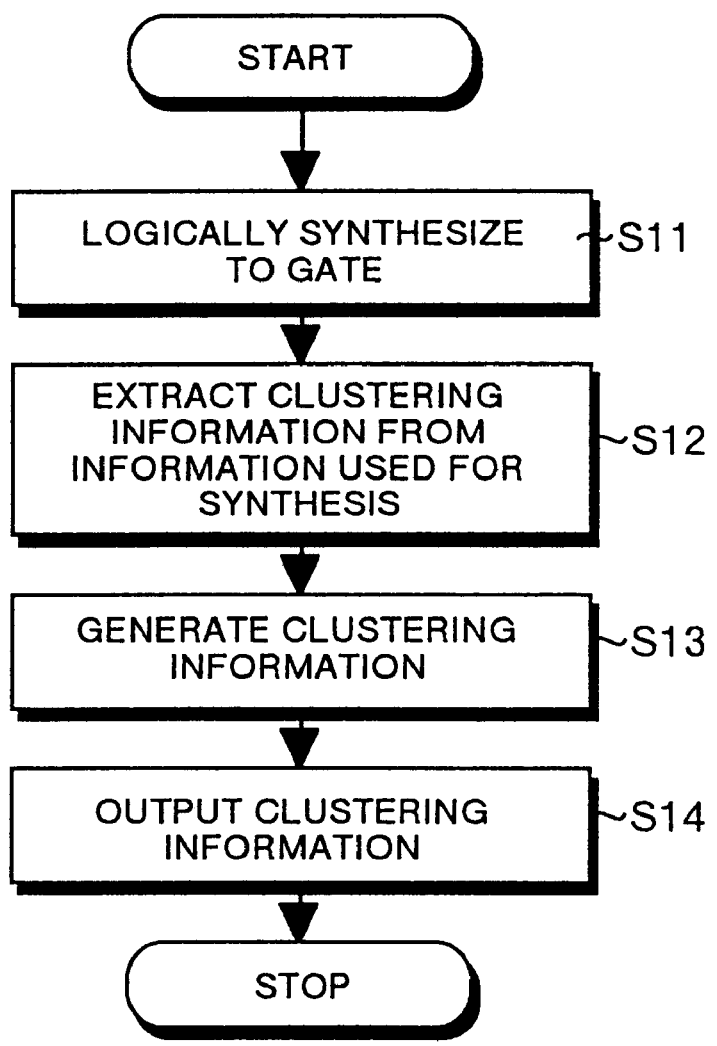
FIG. 3 is a flowchart showing the process for producing and outputting clustering information according to the first embodiment.

The processing of the logic synthesis tool and the layout tool according to this embodiment executed in the computer system described above will be explained in detail. First, the process for the production and output of the clustering information with the logic synthesis tool according to this embodiment will be explained. FIG. 3 is a flowchart showing the process for producing and outputting the clustering information. The difference between the process shown in FIG. 3 and the conventional process using the logic synthesis tool lies in the fact that in the present process a gate-level net list is output while at the same time producing and outputting the clustering information.

First, the designer converts the net list produced by high-level HDL description into a gate-level net list utilizing the logic synthesis tool (step S11). At the same time, the control unit 101 which executes the logic synthesis tool extracts the information used for the logic synthesis, i.e. the information required for clustering to execute the optimum placement and routing from the logic gap information used for logic optimization (step S12). Specifically, the connection information for the clusterings in the block capable of being synthesized collectively (clusterings optimized for layout) and the connection information between the gates in each clustering are extracted.

Figures 4, 5:
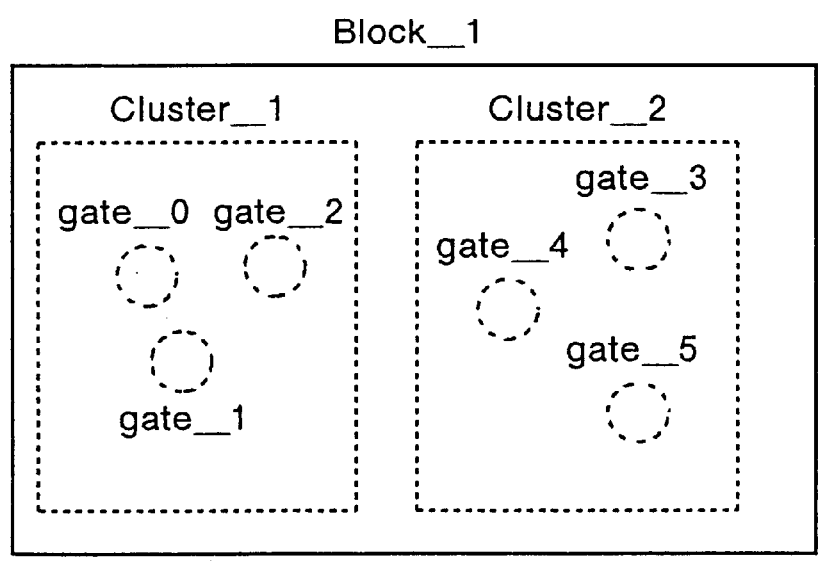
FIG. 4 is a diagram showing a specific example of clustering information.
FIG. 5 is a diagram showing the process of the layout tool for carrying out optimum placement and routing based on the clustering information.

The control unit 101 then generates the clustering information based on the extracted information (step S13). FIG. 4 is a diagram showing a specific example of the description of the clustering information. FIG. 4 indicates that the cluster "Cluster_1" in "Block_1" synthesized collectively at gate level is configured of the gates "gate_0", "gate_1" and "gate_2", and that the cluster "Cluster-2" is configured of the gates "gate_3", "gate_4" and "gate_5".

Finally, the control unit 101 outputs the clustering information generated as mentioned above, together with the gate-level net list after synthesis (step S14). The clustering information produced in this case is a replacement of the hierarchical information not described at the time of output of the net list after synthesis in the conventional art.

The process for optimization of the placement and routing with the layout tool according to this invention will be explained below. FIG. 5 is a diagram showing the process of the layout tool performed for optimum placement and routing based on the clustering information. The difference between the processing shown with reference to FIG. 5 and the process using the conventional layout tool is that in the present process the clustering information is input together with the net list after synthesis and the optimum placement is carried out based on the particular input.

Assume, for example, that the net list after synthesis and the clustering information are input to the layout tool and the placement and routing is carried out based on such input information. In the control unit 101, as shown in FIG. 5, the block obtained from the clustering information is placed, the clusters are then placed in each block, and further the gates are placed in the clusters. Specifically, the processing is performed utilized the layout tool in such a manner that the gates "gate_0", "gate_1" and "gate_2" are placed in "Cluster_1" in "Block_1", and the "gates_3", "gate_4" and "gate_5" are placed in "Cluster_2". The control unit 101 which executes the layout tool carries out the wiring between the gates with all the gates placed in this manner. As a result, the wiring between the gates is accommodated in the clusterings and the redundant wiring can be reduced. Thus, the wiring length can be shortened and the chip area reduced.

As described above, according to this embodiment, unlike in the conventional art, the placement and routing is not carried out taking only the gate connections into consideration. Instead, the clusters in the block are placed based on the gate-level net list and the clustering information output by the processing of the logic synthesis tool. Further, the gates are placed in each cluster and wired. In this way, the optimum placement and routing is realized in which the wiring length is shortened and the chip area reduced.

Figure 6:
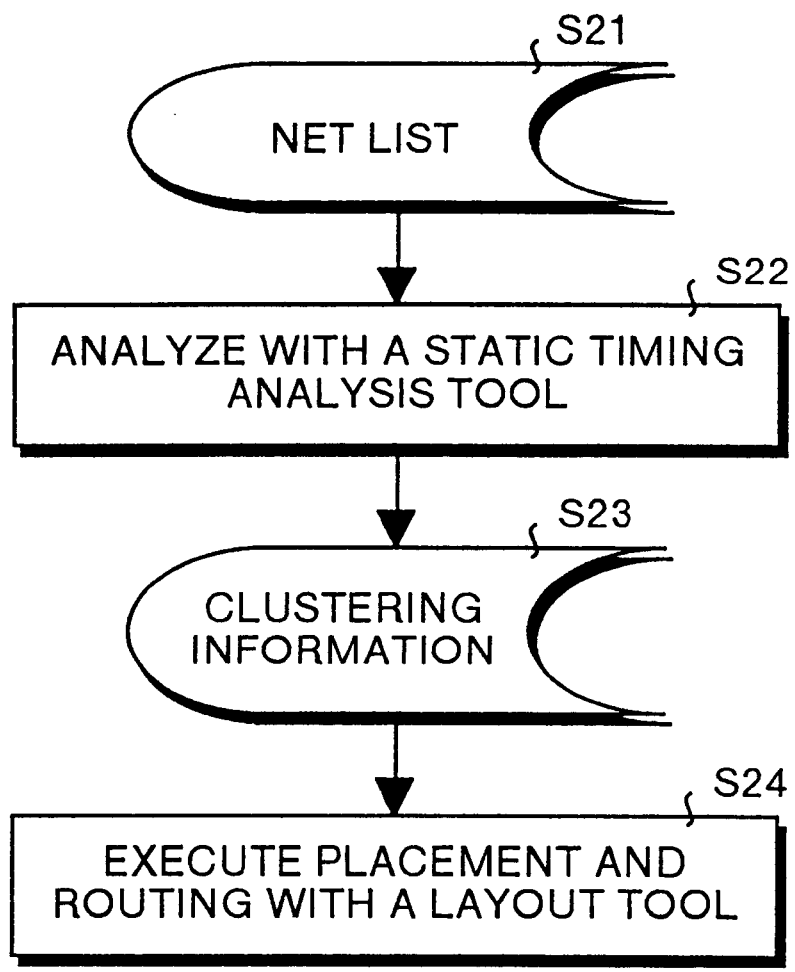
FIG. 6 is a flowchart showing a method for optimizing placement and routing according to a second embodiment of the present invention.

FIG. 6 is a flowchart showing a method for optimizing the placement and routing according to the second embodiment of the present invention. This embodiment, like the first embodiment, is suitably applicable to the LSI design that uses the hardware description language (HDL). First, a net list constituting the connection information described using the HDL is produced by the LSI designer (step S21).

After that, the net list produced by the designer is subjected to timing analysis utilizing a static timing analysis tool according to this embodiment. This static timing analysis tool will be described in detail later (step S22). The clustering information for optimum placement and routing is output (step S23).

Finally, the net list and the clustering information making up the output of the static timing analysis tool are provided as input into the layout tool according to this embodiment. This layer tool will be described in detail later. The optimum placement and routing is then performed (step 24).

As described above, according to this embodiment, the optimum placement and routing is accomplished by inputting the net list described using the HDL and the clustering information to the layout tool.

The configuration of the computer system which is operated as an apparatus for executing the method of the optimum placement and routing described above and is capable of executing the program of the static timing tool and the layout tool described above is similar to the configuration of FIG. 2 in the first embodiment. Only the operation different from the first embodiment will be described. In FIG. 2, the control unit 101 executes the process (the process shown in FIGS. 7, 8, 9 described later) related to the static timing analysis and the placement (layout) and routing. The memory unit 102 is a memory as RAM or ROM, and stores the program to be executed by the control unit 101 and the required data obtained in the process. The display unit 103 is a CRT or a LCD (liquid crystal display), and displays various screens to the user (the LSI designer) of the computer system. The input unit 104 is a keyboard or a mouse, and used by the operator of the computer system to input various information. The CD-ROM 200 stores therein a program of the process shown in FIG. 6.

In the computer system configured as described above, first, the CD-ROM 200 is set in the CD-ROM drive unit 105 and the program stored in the CD-ROM 200 is installed in the disk unit 106. When the computer system starts operating, the program is read from the disk unit 106 stored in the memory unit 102. The control unit 101 (CPU) executes the process shown in FIG. 6 in accordance with the program stored in the memory unit 102.

In the present invention, a program describing the process of the static timing analysis and also the layout tool is supplied on the CD-ROM 200 as a recording medium. However, the recording medium is not limited to this and a recording medium such as a magnetic disk like a floppy disk, a magneto-optical disk, a magnetic tape or the like can be used. Further, this program can be stored in the disk unit 106 beforehand.

Figure 7:
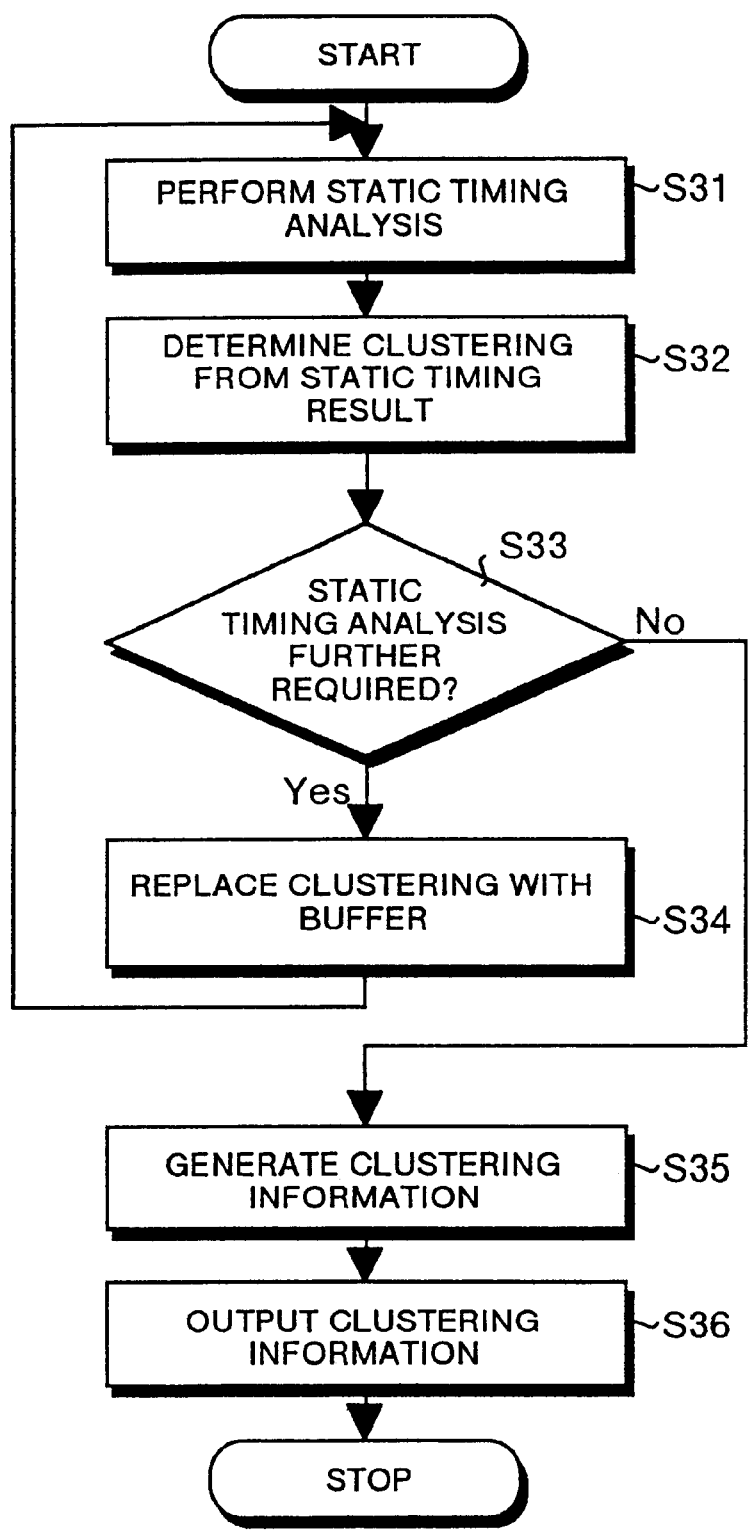
FIG. 7 is a flowchart showing the process for producing and outputting the clustering information according to the second embodiment.

The process for the static timing analysis tool and the layout tool according to this embodiment executed in the computer system is explained in detail below. First, the process for producing and outputting the clustering information for the static timing analysis tool according to this embodiment will be explained. FIG. 7 is a flowchart showing the process for producing and outputting the clustering information.

Static timing analysis is carried out based on the net list described in HDL (step S31) in the control unit 101 for executing the static timing analysis tool. Path delay between the flip-flops is extracted from the result of the static timing analysis thereby to acquire the information required for clustering to execute the optimum placement and routing (step S32). Specifically, the clusters are formed in the descending order of rigidity of the timing restraint based on the timing analysis result of the net list.

FIG. 8 is a diagram showing an example of forming clusters. When the timing restraint is most rigid between the flip-flop "A" and the flip-flop "D", for example, according to this embodiment, as shown, the cluster "1" is formed between the flip-flops "A" and "D". When the timing restraint is rigid between the flip-flops "A" and "E", on the other hand, the cluster "2" is formed between the flip-flops "A" and "E". In similar fashion, the clusters "3" and "4" are formed between the flip-flops "B" and "E" and between the flip-flops "C" and "E", respectively.

After performing the process of step S32 described above, the control unit 101 determines whether there is a need to determine a higher-level clustering in the block capable of being collectively synthesized (step S33). If it is determined that there is no need to determine a higher-level clustering as between the flip-flops "A" and "D" (NO in step S33), for example, as shown in FIG. 8, the high-level cluster "Cluster_1" is formed with the flip-flop "A", the cluster "1" and flip-flop "D". If it is determined that there is a need to determine a high-level clustering as between the flip-flops "B" and "E" and between "C" and "E" (YES in step S33), on the other hand, the delay amount of the determined clustering is held and replaced by a buffer (step S34), after which the static timing analysis is performed again (step S31), as shown in FIG. 8, so that the higher-level cluster "Cluster_2" is formed with the flip-flop "B", the cluster "3" and the flip-flop "E" ("B"–"3"–"E") and with the flip-flop "C", the cluster "4" and the flip-flop "E" ("C"–"4"–"E") . Although the "Cluster-1" and the "Cluster-2" are generated in the case under consideration, the process is repeated actually until the gate size in the clustering becomes about the same as the gate size in the block that can be synthesized collectively (NO in step S33).

The control unit 101 generates the clustering information based on the clusters determined as described above (step S35). FIG. 9 is a diagram showing a specific example of the description of the clustering information. FIG. 9 indicates that the path delay in "A"–"1"–"D" in "Cluster_1" in "Block_1" capable of being collectively synthesized is 2 ns, and further that the path delay of "B"–"3"–"E" and "C"–"4"–"E" in "Cluster_2" is 1 ns.

Finally, the control unit 101 outputs the clustering information produced as described above with a net list described using HDL (step S36). By generating the clustering information in this way, according to this embodiment, the hierarchical information originally not described can be added after synthesis. Further, since the path delay information is added as shown in FIG. 9, more detailed information can be supplied to the layout tool.

Optimization of the placement and routing by the layout tool according to this embodiment will be explained below. Assume, for example, that the net list and the clustering information shown in FIG. 9 are input to the layout tool and the placement and routing is carried out based on these information. The control unit 101 arranges the gates in the clusters in the descending order of rigidity of timing restraint. Specifically, according to this embodiment, since the path delay between flip-flops in the cluster is obtained utilizing the clustering information, the gates in the clusters can be arranged in the descending order of path delay so that the wiring length can be shortened.

In FIG. 9, for example, the flip-flops and the clusterings are arranged in such a manner that the wiring is shortest in the section "A"–"1"–"D" where the path delay is largest. The flip-flops and clusters are then arranged in such a manner that the wiring length in the sections "B"–"3"–"E" and "E"–"4"–"C" is shortened. Finally, after arranging the section "A"–"2"–"E", the flip-flops and the clusterings are wired. As a result, the wiring between the gates is accommodated in the clusterings. Further, the path delay and the connection information between the flip-flops can be obtained. Thus, the redundant wiring can be reduced, so that both the wiring length and the chip area can be reduced.

As described above, according to this embodiment, the placement and routing is not carried out taking only the gate connection into consideration as in the conventional art. Instead, the clusters are arranged in the block based on the net list described in HDL and the clustering information (including the path delay between the flip-flops) output by the processing of the static timing analysis tool, and these gates are wired. Further, the gates are arranged in each cluster and wired. Thus, the wiring length can be shortened and the chip area can be reduced, thereby making it possible to realize the optimum placement and routing. This embodiment is also applicable to the net list described in HDL hierarchically.

Figure 10:
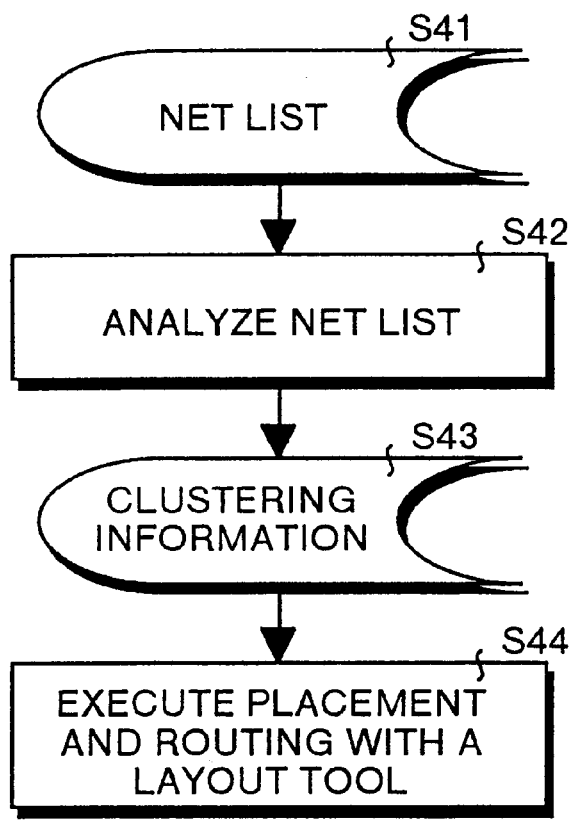
FIG. 10 is a flowchart showing a method for optimizing placement and routing according to a third embodiment of the present invention.

FIG. 10 is a flowchart showing a method for optimizing the placement and routing according to the third embodiment of the present invention. This embodiment, like the first and second embodiments, is applicable to the LSI design using the hardware description language (HDL). First, the LSI designer generates a net list constituting the connection information described in HDL (step S41).

After that, the net list generated by the designer is analyzed using the net list analysis tool according to this embodiment (step S42). The clustering information for performing the optimum placement and routing is then output (step S43). The net list analysis tool is described in detail below.

Finally, the net list and the clustering information constituting the output of the net list analysis tool are provided as input into the layout tool of this embodiment, and under this condition, the optimum placement and routing is carried out (step S44).

In this embodiment, like in the second embodiment, the net list described using HDL and the clustering information are input into the layout tool thereby to accomplish the optimum placement and routing.

The configuration of a computer system which operates as an apparatus for executing the method for optimizing the placement and routing and which can execute the program of the net list analysis tool and the layout tool is similar to the configuration shown in FIG. 2 in connection to the first embodiment. Therefore, only the part of the operation different from the first and second embodiments will be explained below. In FIG. 2, the control unit 101 executes the process (the process shown in FIGS. 11, 12, 13 described later) for the net list analysis and the placement (layout) and routing. The memory unit 102 is a memory such as RAM or ROM, and stores the program to be executed by the control unit 101 and the required data obtained in the process. The display unit 103 is a CRT or a LCD (liquid crystal display) for displaying various screens to the user (the LSI designer) of the computer system. The input unit 104 is a keyboard or a mouse and the like and used by the user of the computer system to input various information. The CD-ROM 200 stores therein the program describing the process shown in FIG. 10.

In the computer system configured as described above, first, the CD-ROM 200 set in the CD-ROM drive unit 105 and the program stored in the CD-ROM 200 is installed in the disk unit 106. When the computer system begins to operate, the program is read from the disk unit 106 and stored in the memory unit 102. The control unit 101 (CPU) then executes the process shown in FIG. 10 according to the program stored in the memory unit 102.

Although this invention provides a program describing the process of the net list analysis tool and the layout tool in the CD-ROM 200 as a storage medium, the storage medium is not limited to this. The storage medium could be a magnetic disk such as a floppy, a magneto-optic disk, a magnetic tape, etc. and it may be selected based on the used computer system. Further, this program may be stored in the disk unit 106 beforehand.

Figure 11:
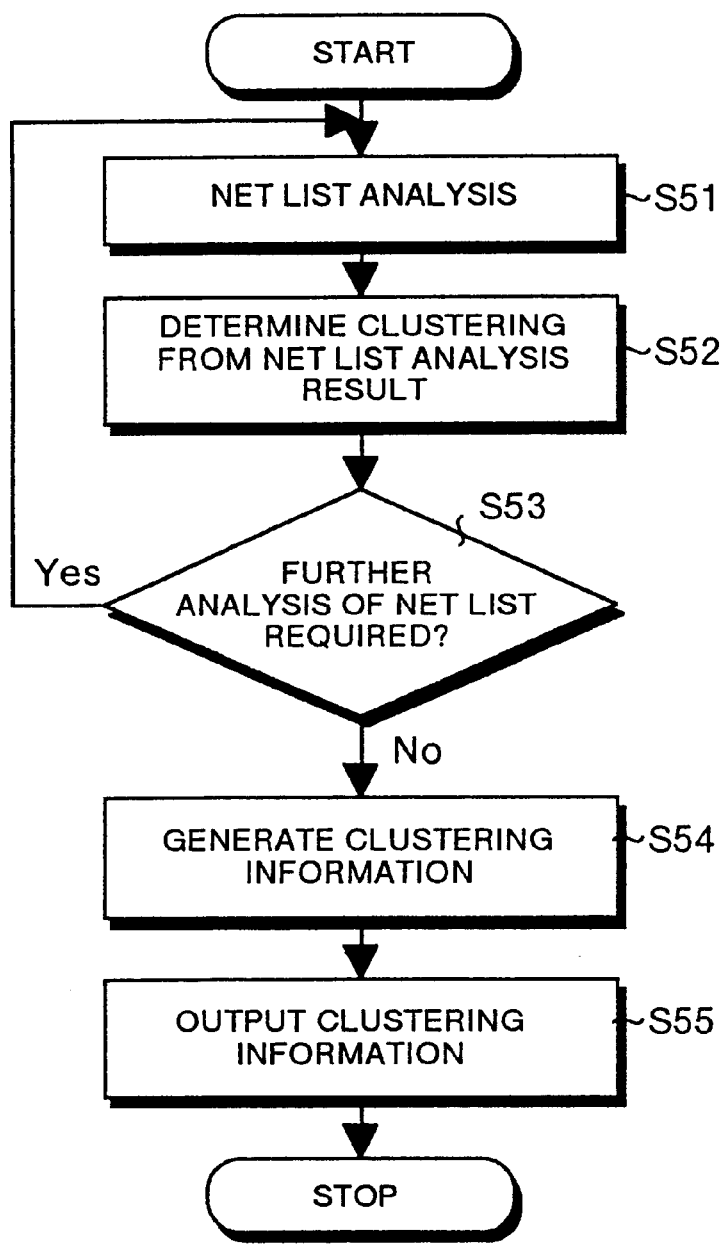
FIG. 11 is a flowchart showing the process for producing and outputting the clustering information according to the third embodiment.

The process of the net list analysis tool and the layout tool executed in the computer system according to this embodiment will be explained in more detail. First, the process for generating and outputting the clustering information for the net list analysis tool according to this embodiment will be explained. FIG. 11 is a flowchart showing the process of generating and outputting the clustering information.

First, in the control unit 101 for executing the net list analysis tool, the net list (connection information) is analyzed based on the net list described in HDL, and the net list is traced from each output pin of the block capable of being synthesized collectively to the gate just before the connection to each flip-flop. Then, the net list is traced from the input pin of each flip-flop to the gate just before connection to the output pin of the next flip-flop. Subsequently, the net list is traced to the next flip-flop sequentially (step S51).

Figures 12, 13:
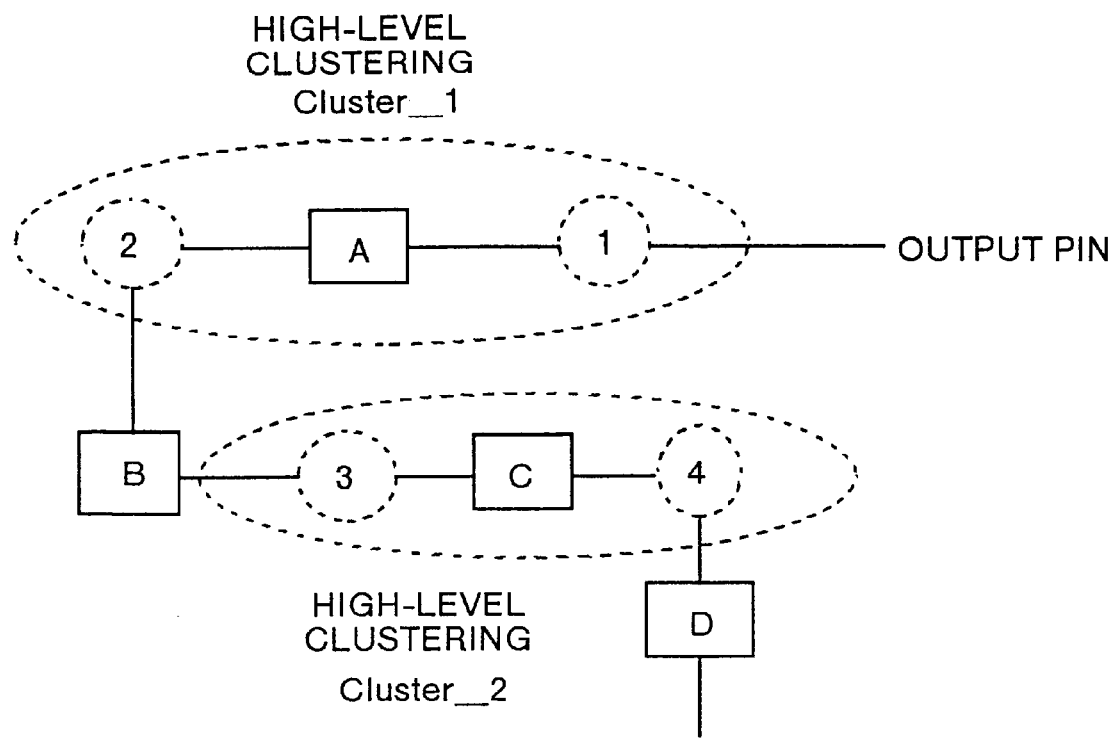
FIG. 12 is a diagram showing another example of forming clusters.
FIG. 13 is a diagram showing a specific example of clustering information.
Figure 14:
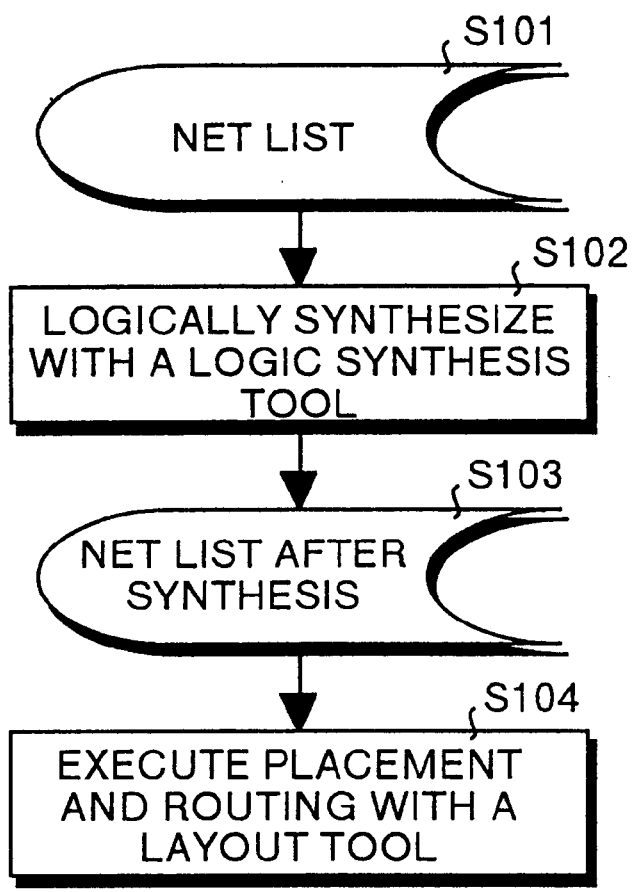
FIG. 14 is a flowchart showing the conventional method of placement and routing.

The net list traced sequentially in this way is recognized as one cluster in the control unit 101 (step S52). FIG. 12 is a diagram showing an example of forming the cluster recognized in this way. Specifically, in FIG. 12, the net list first traced corresponds to the cluster "1", and the next traced net list corresponds to the cluster "2", followed by the second and third traced net list corresponding to clusterings "3", "4", respectively. This information is retained as the clustering information.

After executing the process of step S52, the control unit 101 determines whether there is any room for determining a higher-level cluster in the block capable of being collectively synthesized (step S53). When there is no room for determining a higher-level cluster (NO in step S53), for example, a higher-level cluster is formed only with one cluster. When there is still room for determining a higher-level clustering like the cluster "1" (YES in step S53), on the other hand, the net list is analyzed again (step S51), and as shown in FIG. 12, the higher-level cluster "Cluster_1". is formed by the net list "1"–A–"2" (step S52). In this case, as shown, "Cluster_1" and "Cluster_2" are generated. Actually, however, in accordance with the block size capable of being synthesized collectively, the process is repeated until the gate size in the cluster becomes substantially the same as the gate size in the block capable of being synthesized collectively (NO in step S53). When the flip-flops are successive, i.e. in the absence of the cluster "2" in FIG. 12, for example, the higher-level cluster "Cluster_1" is configured with only one cluster "1" and one flip-flop.

The control unit 101 then generates the clustering information based on the cluster determined (step S54). FIG. 13 is a diagram showing a specific example of the description of the clustering information. In FIG. 13, the first line indicates that the cluster "Cluster_1" is configured with "1"–"A"–"2", and the second line indicates that the "Cluster_2" is configured with "3"–"C"–"4".

Finally, the control unit 101 outputs the generated clustering information and also the net list described in HDL (step S55). In this way, according to this embodiment, the hierarchical information not originally described can be added after synthesis by generating the clustering information. Like the first embodiment, therefore, the more detailed information can be supplied to the layout tool.

The process for optimizing the placement and routing in the layout tool according to this embodiment will be explained below. Assume, for example, that the net list and the clustering information shown in FIG. 13 are input into the layout tool, and the placement and routing is carried based on these information. The control unit 101, after arranging the higher-level clusters "Cluster_1" and "Cluster_2" obtained from the clustering information, arranges each gate in these clusters. The control unit 101 for executing the layout tool performs the wiring between the gates with all the gates arranged in this way. As a result, the wiring between the gates is accommodated in the clustering and the redundant wiring can be reduced, so that the wiring length can be shortened and the chip area can be reduced.

As described above, according to this embodiment, the placement and routing is not carried out taking only the gate connections into account. Instead, the clusterings in the block are arranged and the gates are arranged and wired in each clustering based on the clustering information output by the processing based on the net list described in HDL and the processing of the net list analysis list. Therefore, an optimum placement and routing is realized permitting the wiring length to be shortened and the chip area to be reduced.

According to the first aspect of the present invention, the placement and routing is not carried out by taking only the gate connections into consideration as in the conventional art. In addition, the clusterings in the block are arranged based on the net list of gate level and the clustering information output by the processing of the logic synthesis step and the gates are arranged in the clusterings and wired. Therefore, a method and an apparatus for optimizing the placement and routing capable of realizing optimum placement and routing, permitting the wiring length to be shortened and the chip area to be reduced can be obtained.

Further, the connection information of each clustering in a block and the connection information between gates in each clustering are extracted, and based on these information, the clustering information is generated thereby to complement the hierarchical information not described. Therefore, a method and an apparatus for optimizing the placement and routing capable of providing a detail information to the layout tree can be obtained.

Further, the wiring between the gates can be accommodated in the clustering, resulting in a reduced redundant wiring. Therefore, a method and an apparatus for optimizing the placement and routing capable of shortening the wiring length and reducing the chip area can be obtained.

According to another aspect of the present invention, the placement and routing is not carried out taking only the gate connections into consideration. In addition, the clusterings are arranged in a block based on the net list described in HDL and the clustering information (including the path delay between the flip-flops) output by the processing of the timing analysis step. Further, the gates are arranged in the clusterings, respectively, and are wired. Therefore, a method and an apparatus for optimizing the placement and routing capable of shortening the wiring length and reducing the chip area can be obtained.

Further, the clustering information is generated based on the path delay information between the flip-flops. Thus, the hierarchical information which is not described already is complemented. Further, the path delay information is also appended. Therefore, a method and an apparatus for optimizing the placement and routing capable of providing a detail information to the layout tree can be obtained.

According to the another aspect of the present invention, the placement and routing is not carried out taking only the gate connections into consideration as in the conventional art. In addition, the clusterings are arranged in a block based on the net list described in HDL and the clustering information (including the path delay between the flip-flops) output by the processing of the timing analysis step. Further, the gates are arranged in the clusterings, respectively, and are wired. Therefore, a method and an apparatus for optimizing the placement and routing capable of realizing optimum placement and routing, permitting the wiring length to be shortened and the chip area to be reduced can be obtained.

Further, the clustering information is generated based on the net list acquired from the information between each output terminal of the block and each flip-flop and the information between the flip-flops. Further, the path delay information is also appended. Therefore, a method and an apparatus for optimizing the placement and routing capable of providing a detail information to the layout tree can be obtained.

According to still another aspect of the present invention, the clusterings are arranged in a block based on the net list of gate level output by the processing of logic synthesis and the clustering information. Further, each gate is arranged in a corresponding clustering, and these gates are wired. Therefore, a method and an apparatus for optimizing the placement and routing capable of realizing optimum placement and routing, permitting the wiring length to be shortened and the chip area to be reduced can be obtained.

Further, the wiring between the gates can be accommodated in the clustering and the delay pass between the flip-flops and the net list is obtained so that the redundant wiring can be reduced. Therefore, a method and an apparatus for optimizing the placement and routing capable of shortening the wiring length and reducing the chip area can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method for optimizing placement and routing comprising:

producing a net list constituting connection information of a circuit in a hardware description language;

generating path delay information on path delays between flip-flops in the net list;

determining clusterings in a descending order starting from a clustering having a largest path delay to a clustering having a smallest path delay, based on the path delay information;

determining a block including a high-level clustering, the high-level clustering including at least two of the clusterings and having a higher hierarchy than that of the at least two clusterings;

generating clustering information, including the path delay information, expressing configurations of the clusterings, and including hierarchic information on all the clusterings in the block; and executing placement and routing based on the net list and the clustering information.

2. The method according to claim 1, wherein placement and routing includes placing the clusterings in descending order based on the clustering information, placing gates corresponding to each of the clusterings after the clusterings are placed, and wiring the gates after all of the gates are placed.

* * * * *